United States Patent
Fishbune et al.

(10) Patent No.: US 10,630,084 B2
(45) Date of Patent: Apr. 21, 2020

(54) BATTERY MANAGEMENT SYSTEM FOR EXTENDING SERVICE LIFE OF A BATTERY

(71) Applicant: International Business Machines Corporation, Armonk, NY (US)

(72) Inventors: Richard J. Fishbune, Rochester, MN (US); Xing Li, Shenzhen (CN); Robert B. Schlak, Hyde Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/849,817

(22) Filed: Dec. 21, 2017

(65) Prior Publication Data

US 2019/0199107 A1    Jun. 27, 2019

(51) Int. Cl.
H02J 7/00    (2006.01)

(52) U.S. Cl.
CPC .................................. *H02J 7/0021* (2013.01)

(58) Field of Classification Search
CPC .................................................... H02J 7/0021
USPC ........................................................ 320/132
See application file for complete search history.

(56) References Cited

U.S. PATENT DOCUMENTS

| | | | |
|---|---|---|---|
| 5,652,502 A * | 7/1997 | van Phuoc | H01M 6/5011 |
| | | | 702/63 |
| 5,955,869 A * | 9/1999 | Rathmann | G01R 31/3648 |
| | | | 320/132 |
| 7,400,113 B2 | 7/2008 | Osborne | |
| 7,612,532 B2 | 11/2009 | Verbrugge | |
| 8,342,103 B2 * | 1/2013 | Barbee | B61C 3/02 |
| | | | 105/50 |
| 8,497,686 B2 | 7/2013 | Hoshino | |
| 8,872,518 B2 | 10/2014 | Liu et al. | |
| 8,878,489 B2 * | 11/2014 | Chou | G01R 31/3832 |
| | | | 320/112 |
| 9,018,897 B2 * | 4/2015 | Nakamura | G01R 31/392 |
| | | | 320/107 |
| 9,466,992 B2 | 10/2016 | Darragh et al. | |
| 9,527,400 B2 | 12/2016 | Rhodes et al. | |

(Continued)

OTHER PUBLICATIONS

Dubarry, Matthieu, et al. (2007). Capacity loss in rechargeable lithium cells during cycle life testing: The importance of determining state-of-charge. Journal of Power Sources 174.2 (2007): 1121-1125.

(Continued)

*Primary Examiner* — M Baye Diao
(74) *Attorney, Agent, or Firm* — Cantor Colburn LLP; Tihon Poltavets

(57) ABSTRACT

Battery management systems and methods for optimizing and extending the service life of a battery generally include subjecting the battery to a test cycle that appropriately sets the state of charge for the battery to less than the nominal capacity of the battery, i.e., to less than 100% state of charge. The state of charge of other batteries in the system not being tested can be increased to insure that the system battery capacity is not degraded during the test cycle. Periodic testing of the battery and adjusting the state of charge maintains an optimal state of charge as the battery ages. Batteries that do not meet the required capacity can be readily identified and replaced on demand.

20 Claims, 6 Drawing Sheets

(56) References Cited

U.S. PATENT DOCUMENTS

| | | | |
|---|---|---|---|
| 2010/0085009 A1* | 4/2010 | Kang | H02J 7/0016 |
| | | | 320/118 |
| 2013/0015860 A1 | 1/2013 | Crombez | |
| 2014/0214347 A1* | 7/2014 | Laskowsky | G06F 17/00 |
| | | | 702/63 |
| 2014/0244225 A1 | 8/2014 | Balasingam et al. | |
| 2015/0377976 A1 | 12/2015 | Maluf et al. | |
| 2016/0156202 A1 | 6/2016 | Kim | |
| 2017/0234934 A1* | 8/2017 | Zhong | G01R 31/367 |
| | | | 702/63 |
| 2017/0285107 A1 | 10/2017 | Gholam-Abbas | |
| 2018/0034285 A1* | 2/2018 | Baumgartner | H02J 7/0021 |
| 2019/0025377 A1* | 1/2019 | Sejima | H01M 10/48 |

OTHER PUBLICATIONS

Lu, Languang, et al. (2013). A review on the key issues for lithium-ion battery management in electric vehicles. Journal of power sources 226 (2013): 272-288.

Rong, Peng, and Massoud Pedram. (2006). An analytical model for predicting the remaining battery capacity of lithium-ion batteries. IEEE Transactions on Very Large Scale Integration (VLSI) Systems 14.5 (2006): 441-451.

* cited by examiner

BATTERY MANAGEMENT SYSTEM FOR EXTENDING SERVICE LIFE OF A BATTERY

BACKGROUND

The present invention generally relates to battery management systems, and more specifically, battery management systems for optimizing and extending the service life of a battery.

Data operations (data processing, management, analysis, etc.) have become a key component of modern business and in industries from banking to online retail and from insurance to airlines. Often, these data operations are critical to the operation of the company and any downtime can lead to losses of millions or billions of dollars in revenue. Businesses use large IT equipment (such as, but not limited to, the mainframe) to perform these data operations and since the operations are mission critical, the IT equipment itself is mission critical and must not experience downtime.

Large IT equipment in a data center environment is run off of main power lines. In the event of a loss of power from the main line, backup generators will turn on to continue providing power to the data center and to all of the IT equipment contained within. However, there can be a lag time between the loss of the main line power and the start of the generators during which the IT equipment will not be functioning. For mission critical applications and IT equipment this lag time is unacceptable so mission critical IT equipment will have an inline battery backup system to ensure that the system always has a source of power, even during the time between a failure of the main line power and the start of the generator (typically 30 seconds or less).

SUMMARY

Embodiments of the present invention are directed to a battery management system and process for optimizing and extending the service life of a battery. A non-limiting example of the method in accordance with one or more embodiments includes determining an initial state of charge (SoC) of the battery based at least in part on a nominal capacity profile and an operational capacity requirement, and determining a test voltage for the battery based on the initial SoC and a correction factor. The battery is set to the test voltage and discharged at a rate determined by the operational capacity requirement for the battery. A discharge voltage of the battery after discharging the battery is measured and a new SoC based at least in part on the discharge voltage is determined. An error value based on the new SoC and the correction factor is determined and a corrected SoC based on combining the error value and the initial SoC is determined. The battery is charged to a new voltage based at least in part on the corrected SoC.

A non-limiting example of the method in accordance with one or more embodiments includes partially charging the battery to a set point state of charge (SoC); periodically testing the battery and adjusting the SoC set point. A testing cycle includes increasing the SoC set points of other batteries in the system to maintain a required capacity for the system during the test cycle; setting the battery being tested to a test battery voltage corresponding to an initial SoC set point and a correction factor; discharging the battery being tested at the required capacity; measuring the battery voltage after discharging the battery and determining a SoC at the measured battery voltage; determining an error value based on the SoC at the measured battery voltage and the correction factor; adjusting the initial SoC set point to a new set point SoC based on combining the error value and the initial SoC; and adjusting a voltage of the battery to the new SoC set point.

A non-limiting example of the battery management system includes a battery; and a controller circuit. The controller circuit is operable to determine an initial state of charge (SoC) of the battery based at least in part on a nominal capacity profiled determine a test voltage for the battery based on the initial SoC and a correction factor; set the battery to the test voltage; discharge the battery at a rate, wherein the rate is determined by an operational capacity requirement for the battery; measure a discharge voltage of the battery after discharging the battery; determine a new SoC based at least in part on the discharge voltage; determine an error value based on the new SoC and the correction factor; determine a corrected SoC based on combining the error value and the initial state of charge; and charge the battery to a new voltage based at least in part on the corrected SoC.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
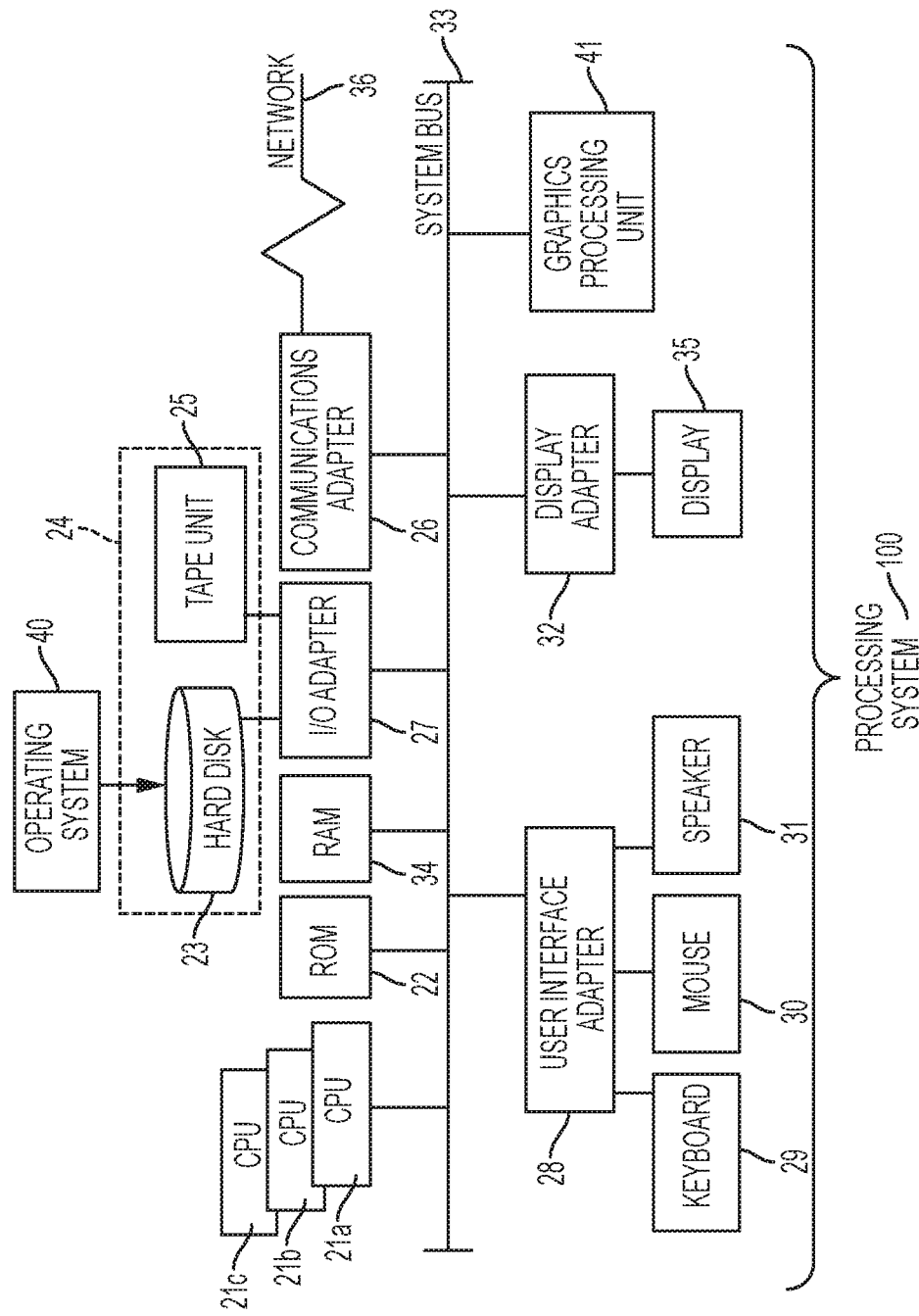
FIG. 1 depicts a block diagram of a computer system for use in implementing one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Disclosed herein are battery management systems and methods for extending the service life of a rechargeable battery. Applicable rechargeable batteries are those experiencing a reduction in service life when maintained at a higher state of charge (SoC), e.g., lithium batteries. In general, the SoC of a battery is defined as the ratio of its current capacity ($Q(t)$) to the nominal capacity ($Q_n$). The nominal capacity is given by the battery manufacturer and represents the maximum amount of charge that can be stored in the battery. For example, the SoC can be considered as the equivalent of a fuel gauge for the battery pack in a battery electric vehicle (BEV), a hybrid vehicle (HV), or plug-in hybrid electric vehicle (PHEV). The units of SoC are typically expressed as percentage points (0%=empty; 100%=full). As will be described in greater detail herein, the present invention adjusts the SoC of the battery regardless of the causal factors affecting the decrease in service life, e.g., temperature, age, number of discharges, and the like.

Referring now to FIG. 1, there is shown an exemplary processing system 100, i.e., controller unit circuit, for implementing the teachings herein. The illustrated system 100 has one or more central processing units (processors) 21a, 21b, 21c, etc. (collectively or generically referred to as processor(s) 21). Each processor 21 may include a reduced instruction set computer (RISC) microprocessor. The processors 21 are coupled to system memory 34 and various other components via a system bus 33. Read only memory (ROM) 22 is coupled to the system bus 33 and may include a basic input/output system (BIOS), which generally controls basic functions of system 100.

FIG. 1 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 100 may be stored in mass storage 24. A network adapter 26 interconnects bus 33 with an outside network 36 enabling data processing system 100 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a super I/O chip integrating multiple device adapters into a single integrated circuit.

The processing system 100 can further include a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 1, the system 100 includes processing capability in the form of processors 21, storage capability including system memory 34 and mass storage 24, input means such as keyboard 29 and mouse 30, and output capability including speaker 31 and display 35. A portion of system memory 34 and mass storage 24 can collectively store an operating system and coordinate the functions of the various components shown in FIG. 1.

Turning now to an overview of technologies that are more specifically relevant to aspects of the invention, large IT equipment, for example, often uses high-voltages inside the power assemblies for efficiency purposes. When the main line goes down, the battery backup needs to provide high-voltage power to the power assemblies (i.e., inside the regulator/converter assembly) to keep the system running.

In order for the battery backup to provide the voltage power necessary to keep the system up and running, a large number of battery cells (e.g., lead acid, lithium ion, etc.) are typically connected in series. The reason for this is that individual cell voltages can be quite low (e.g., approximately 1 to 4 V per cell depending on chemistry) while the battery backup for some applications needs to provide much higher voltages (e.g., approximately 200 to 400 V).

Figure 2:
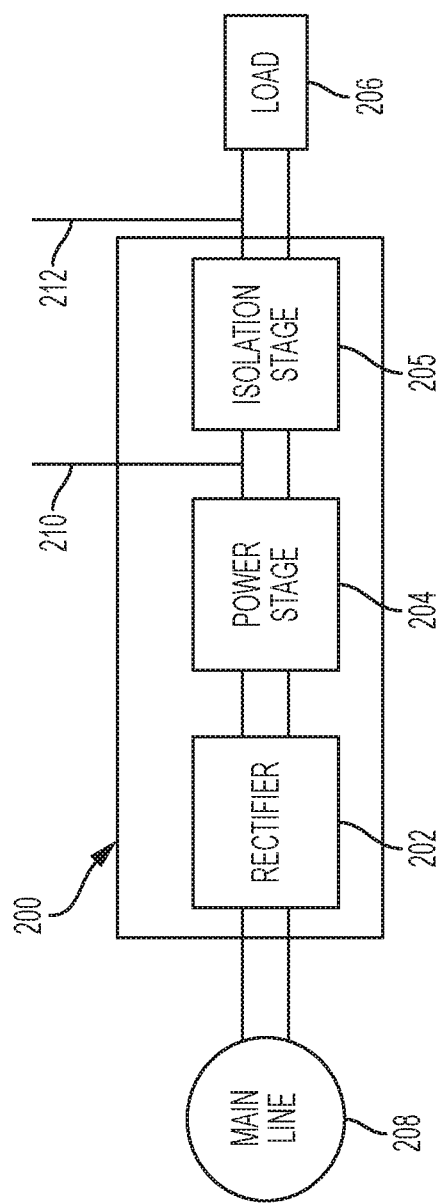
FIG. 2 depicts a block diagram of a power supply with a battery backup according to one or more embodiments of the invention.

For example, FIG. 2 depicts a block diagram of a power supply with a battery backup. The power supply 200 in electrical communication with a main line 208 (AC) power source generally includes a rectifier circuit 202, a power factor conversion stage 204, and an isolation stage 205 that is responsive to a load 206 for the power supply 200. The battery discharge path can be electronically coupled to the output bus 212 between the isolation stage 205 output and the load 206 input or coupled to the intermediate bus 210 between the power factor conversion stage 204 output and the isolation stage 205 input, both of which requires the battery stack to produce the required voltage for the load 206 upon power failure.

As noted above, battery backups are typically charged to 100% of their respective state of charge (SoC), i.e., capacity, which has been found to decrease the service life of a battery relative to one maintained at less than 100% capacity. One or more embodiments of the invention address the above-described shortcomings of the prior art by providing a battery management system and a method for extending the service life of a battery within a battery pack by maintaining the state of charge at less than 100%. Although specific reference herein is made to battery backups for IT systems, it should be apparent that the systems and methods can be applied to any rechargeable battery type applications that experience a decrease in capacity over time, e.g., standby applications that are commonly utilized in data center operations.

Figure 3:
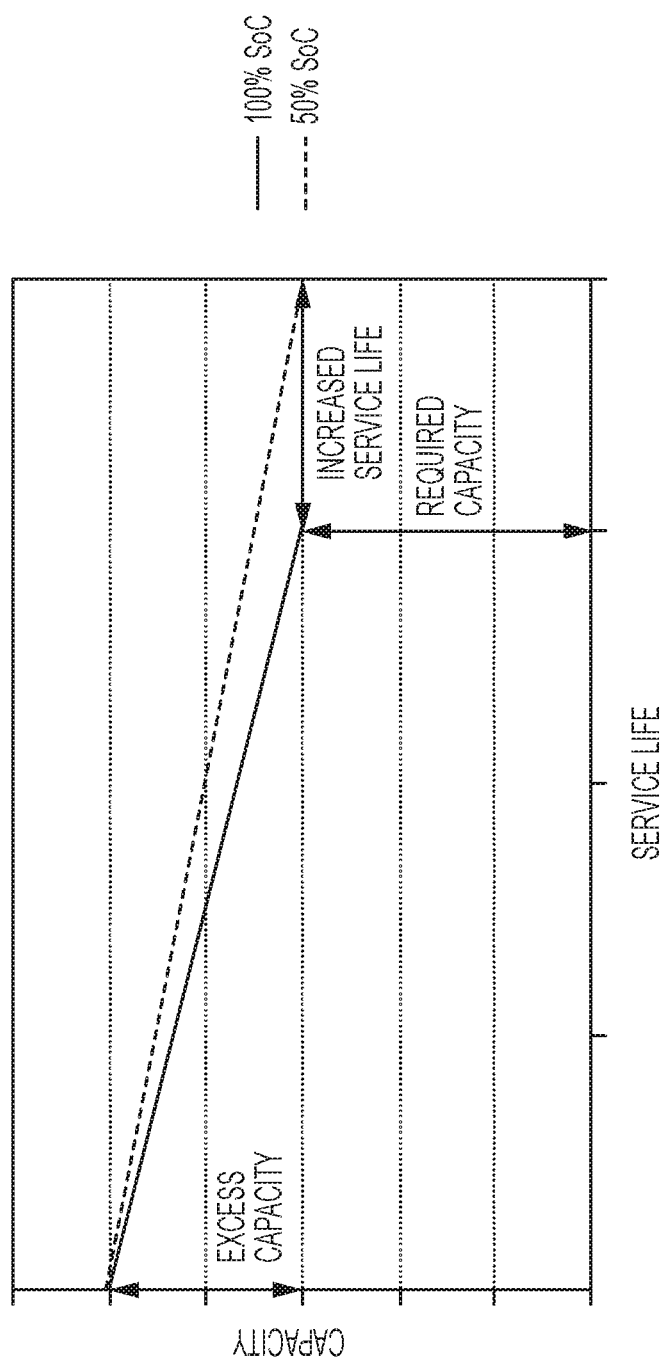
FIG. 3 graphically illustrates service life as a function of the state of charge according to one or more embodiments of the invention.

A battery at the end of its useful operating life has a lower capacity than that a new battery. The capacity difference between a new battery and an old battery still meeting the service requirements can be considered excess capacity when the battery is new. Applicants have found that if a new battery is intentionally charged to a lower SoC, the service life can be extended whereas the capacity at the lower SoC still set so as to satisfy the operating requirements. FIG. 3 graphically illustrates service life as a function of the SoC. As shown, a battery operating at about 50% SoC and still meeting the operating capacity requirements extends the service life of a battery that would typically be charged at 100%. If the service life, i.e., time from battery installation until battery replacement due to capacity being less than that required for the intended task, is increased, a decrease in the total cost of battery ownership advantageously results.

In the present invention, the battery management system and method of optimizing and extending the service life generally includes appropriately setting the SoC to a value less than 100% so as to meet the operating requirements as will be described in greater detail below. The inventive battery management system and method advantageously extends service life without decreasing battery capacity during the testing. Moreover, periodic testing and adjusting of the SoC can be made to optimize the SoC as the battery ages.

In one or more embodiments, the process generally includes periodically testing and adjusting the SoC of a battery within a battery system over the service life of the battery. In this manner, batteries that do not meet the required capacity can be readily identified and replaced, which is advantageous as on demand replacement is preferred over replacement as a function of periodic maintenance. During SoC testing of the battery, the SoC of the one or more of the batteries not being tested can be increased to insure that the battery capacity of the overall backup system is not degraded during the testing cycle of the battery.

Figure 6:
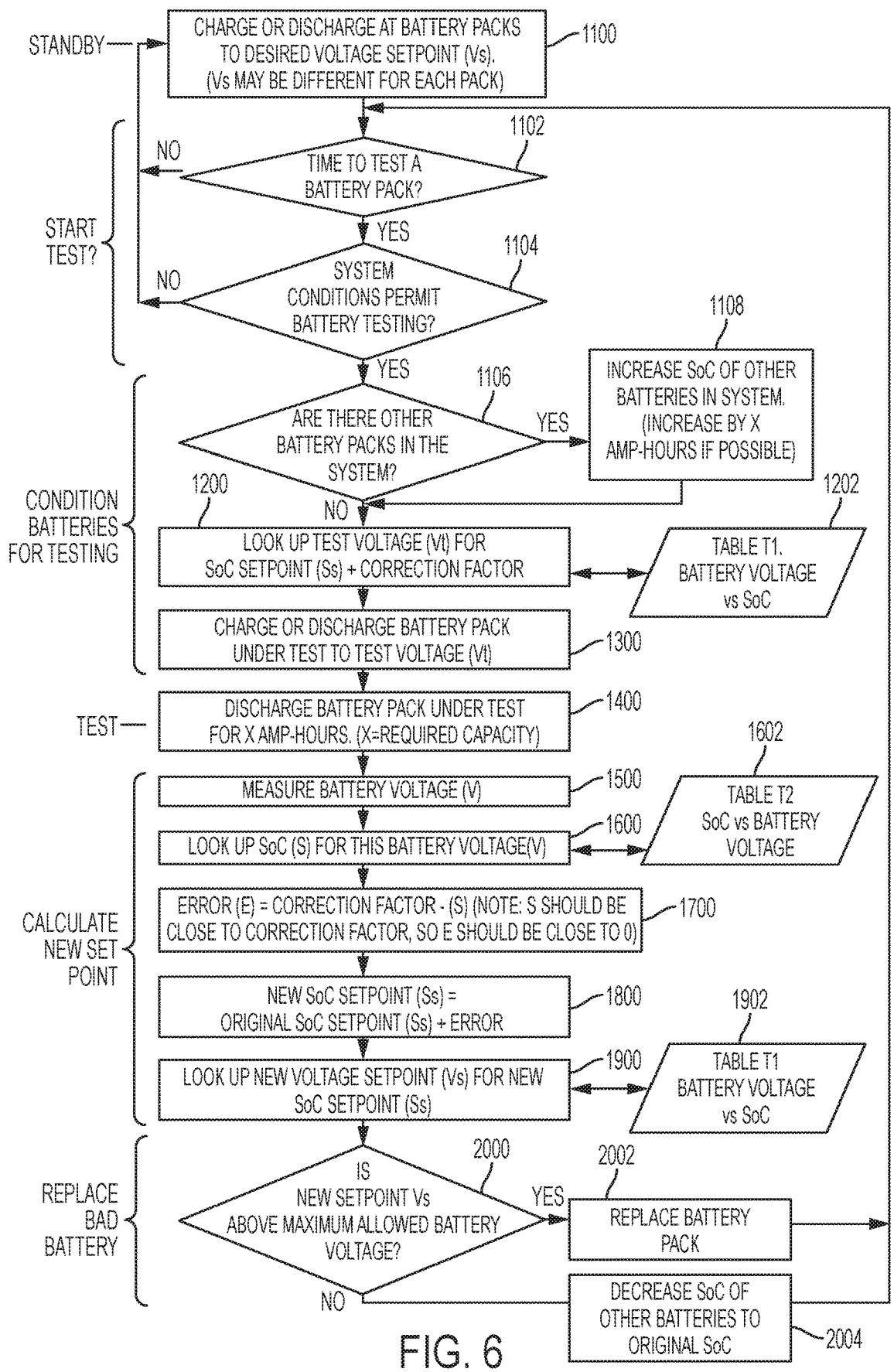
FIG. 6 depicts a flow diagram of a method for extending the service life of a battery according to one or more embodiments of the invention.

Referring now to the flowchart diagram provided in FIG. 6, there is shown a method for extending the service lifetime of a battery. In step 1100, the battery packs are charged to a desired voltage set point (Vs). The Vs can be determined based on the capacity requirements for the system. For example, the battery pack can consist of 10 cells in series with each cell nominally rated at 2.5 amp-hours (A-hr) so that the battery pack can provide 2.5 A-hr. The system may only require a capacity (X) of 1.25 amp-hours (A-hr). Thus, there is clearly excess capacity. As such, the initial SoC set point (Ss) while meeting the capacity needs of the system can be set at 50%, i.e., 1.25 A/hr/2.5 A/hr. The Ss can then be used to determine the Vs.

Figure 4:
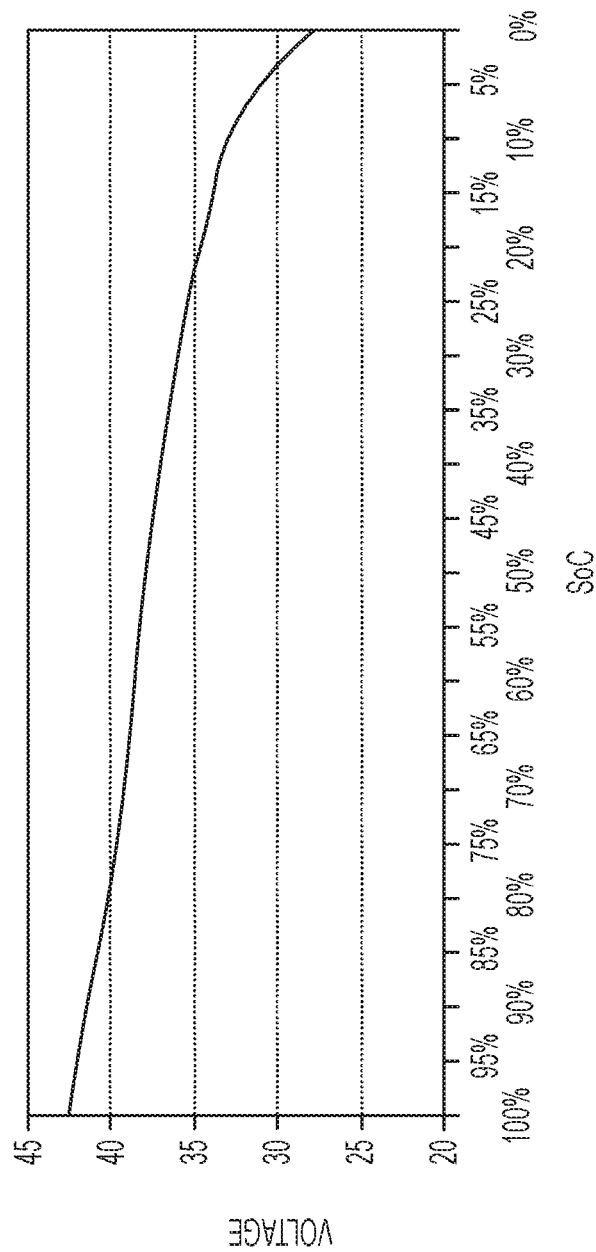
FIG. 4 graphically illustrates voltage as a function of the state of charge according to one or more embodiments of the invention.
Figure 5:
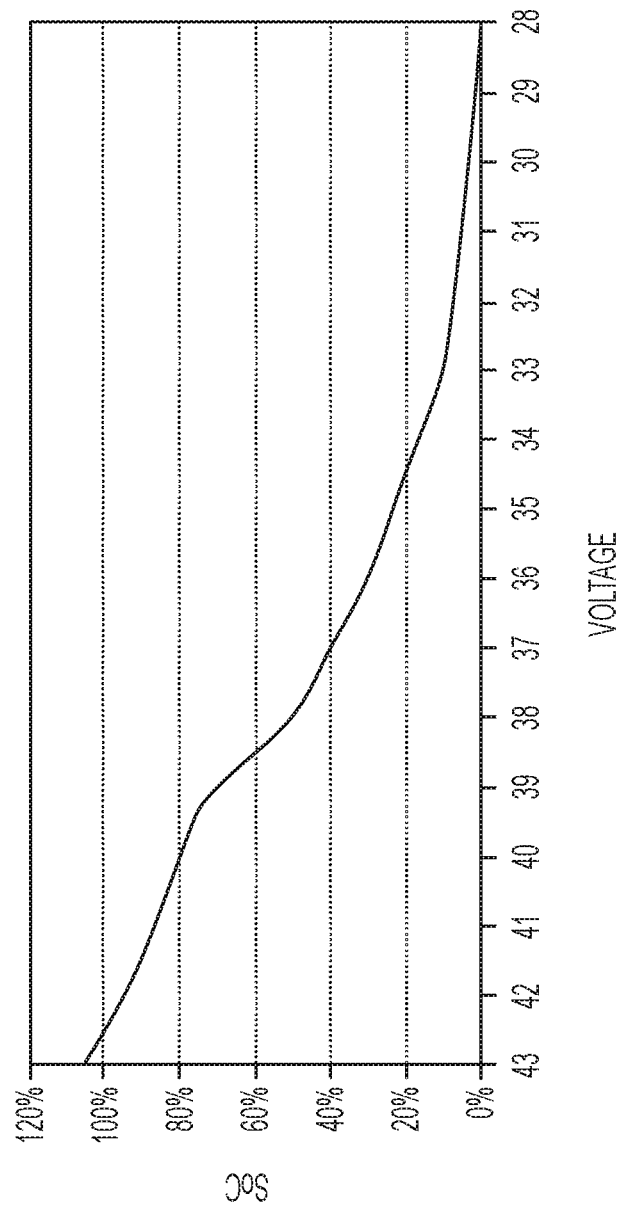
FIG. 5 graphically illustrates state of charge as a function of voltage according to one or more embodiments of the invention.

The Vs can be determined from a lookup table associated with a particular battery profile of a battery that is to undergo testing. A typical new battery profile can be characterized to create look up Tables T1 and T2. T1 contains the SoC percentage values as a function of battery voltage whereas T2 contains the battery voltage values as a function of the SoC percentage values. Graphically, an exemplary T1 for a new battery is shown in FIG. 4 and an exemplary T2 for the battery are shown in FIG. 5. In this example, the pack voltage ranges from about 42V (corresponds to 100% SoC) to about 28 V (corresponds to 0% of SoC).

As noted above, the initial set point Ss can be set at 50% while meeting the capacity requirements of 1.25 A-hr. The Vs for 50% SoC is determined from the lookup table T1 as is graphically shown in FIG. 4, which is 38.0V. Once a decision has been made to test a battery as indicated in step 1102, the system conditions are checked to determine if battery testing is permitted as indicated in step 1104. Once the decision has been made and the system conditions permit testing, a determination is made whether there are any other battery packs within the system as indicated in step 1106. If yes, the SoC of the other batteries within the system can be increased to accommodate testing the battery, as shown at step 1108. For example, the remaining batteries can be increased by X A-hr to compensate for the temporarily reduced capacity of the battery being tested.

For a standby application, the capacity requirement may be expressed in Watt-hours (W-hr) instead of A-hr. In this case, it may be advantageous to construct tables T1 and T2 using W-hr instead of A-hr. The process is generally the same with either unit of measure.

In step 1200, the test voltage (Vt) is determined, which is based on the initial state of charge Ss and a correction factor. The correction factor can be a relatively small percentage greater than the Vs. The lower the value, the more accurately the battery performance is measured whereas the higher the value, the more capacity remains in the batter after testing. By way of example, a correction factor defined by a 5% increase in SoC can be used to determined Vt from look up table T1, i.e., Ss+5%=55%. Referring now to FIG. 4, the test voltage Vt at 55% SoC is 38.3V.

In step 1300, the battery under test is charged or discharged to provide the Vt of 38.3V.

In step 1400, the battery under test is discharged for X A-hr, i.e., discharged for 1.25 A-hr in the example above.

In step 1500, the battery voltage is measured. In the above example, the discharged battery voltage after being discharged for 1.25 A-hr is measured to be 30.0V.

In step 1600, a new SoC for the measured battery voltage after discharge is obtained in step 1500 is determined the lookup table T2 (see FIG. 5). The corresponding SoC (S) for the measured voltage of 30.0V after discharge is 3.3%.

In step 1700, the error value (E) in the previous set point is determined by subtracting the new SoC at the above measured voltage after discharge from the 5% correction factor, i.e., E=5%—3.3% or 1.7%. Ideally, the new SoC should be close to the correction factor so that the amount of error is close to zero. In view of the error value E, the state of charge needs to be increased by 1.7% in the above example.

In step 1800, a corrected SoC set point is determined, which is equal to the initial state of charge set point Ss plus the error value, which is equal to initial SoC set point of 50% plus the 1.7% error value or 51.7%.

In step 1900, a new voltage set point for the corrected SoC set point is determined from lookup table T1 in step 1902. The new voltage set point for the battery at the 51.7% corrected SoC is 38.1V.

In step 2000, the new voltage set point is compared to the maximum allowed battery voltage. If the new voltage set point is greater than the allowed voltage then the battery is replaced as indicated in step 2002. If not greater, then the test is completed and the SoC of the other batteries in the system, which had previously been increased in step 1108, is returned to the original SoC as indicated in step 2004. In a battery management system, an alert can be sent to an end user of the system indicating the on-demand need for battery replacement.

Battery testing can occur on a set schedule, e.g., for inline battery backup systems for critical IT equipment, the schedule can occur monthly, although greater or lesser intervals can be made. It should be noted that very frequent testing, e.g., daily, will decrease battery capacity due to exposing the battery to frequent charge/discharge testing cycles. In contrast, less frequent testing, e.g., yearly, may not keep the batteries optimally charged.

In addition, the initial state of charge set point Ss can increase as the batteries age. Eventually, the battery will no longer be able to be charged to the desired state of charge indicating the need for replacement.

The tables T1 and T2 are accurate for a new nominally functioning battery. The above algorithm adjusts up or down by increments so that the absolute values associated with the table are less relevant. Moreover, it is generally known that accurately determining accurate SoC is fairly difficult using conventional methods.

Advantageously, the invention is configured to adjust the state of charge for a battery pack regardless of the reasons for the capacity decrease such as may occur as a function of temperature, number of discharges, age or the like.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for optimizing and extending a service life of a battery within a battery pack, the method comprising:
   determining an initial state of charge (SoC) of the battery based at least in part on a nominal capacity profile and an operational capacity requirement;
   determining a test voltage for the battery based on the initial SoC and a correction factor;
   setting the battery to the test voltage;
   discharging the battery at a rate, wherein the rate is determined by the operational capacity requirement for the battery;
   measuring a discharge voltage of the battery after discharging the battery;
   determining a new SoC based at least in part on the discharge voltage;
   determining an error value based on the new SoC and the correction factor;
   determining a corrected SoC based on combining the error value and the initial SoC; and
   charging the battery to a new voltage based at least in part on the corrected SoC.

2. The method of claim 1, further comprising replacing the battery if the new voltage exceeds a threshold voltage.

3. The method of claim, 1, further comprising increasing SoC of other batteries in the battery pack prior to setting the battery to the test voltage.

4. The method of claim 3, wherein increasing the SoC of the other batteries comprises increasing capacity of the system to an amount equal to a required capacity for the battery pack.

5. The method of claim 1, wherein the operational capacity requirement of the battery pack is less than the nominal capacity for the battery pack.

6. The method of claim 1, wherein determining the initial SoC of the battery based at least in part on the nominal capacity profile comprises accessing, by a processor, a first look up table (T1) comprising battery voltage as a function of SOC percentage values; and determining the SoC based on the test voltage.

7. The method of claim 1, wherein determining the new SoC based at least in part on the discharge voltage comprises accessing, by a processor, a second look up table (T2) comprising SoC percentage values as a function of battery voltage for the battery; and determining the SoC based on the measured voltage.

8. The method of claim 1, wherein charging the battery to the new voltage based at least in part on the corrected SoC comprises accessing, by a processor, a first look up table (T1) comprising battery voltage as a function of SoC percentage values; and determining the new voltage based on the corrected SoC.

9. The method of claim 1, wherein the method is periodically repeated for the battery.

10. A method of optimizing and extending a service life of a battery in a system, the method comprising:
    partially charging the battery to a set point state of charge (SoC);
    periodically testing the battery and adjusting the set point SoC, wherein a testing cycle comprises:
       increasing SoC set points of other batteries in the system to maintain a required capacity for the system during the test cycle;
       setting the battery being tested to a test battery voltage corresponding to an initial SoC set point and a correction factor;

discharging the battery being tested at the required capacity;

measuring the battery voltage after discharging the battery and determining a SoC at the measured battery voltage;

determining an error value based on the SoC at the measured battery voltage and the correction factor;

adjusting the initial SoC set point to a new set point SoC based on combining the error value and the initial SoC; and adjusting a voltage of the battery to the new SoC set point.

11. The method of claim 10, further comprising replacing the battery when the voltage at the new set point SoC is above a maximum allowed battery voltage.

12. The method of claim 10, wherein the initial SoC set point of the battery is based at least in part on a nominal capacity profile of the battery and an operational capacity requirement.

13. The method of claim 10, wherein setting the battery being tested to the test battery voltage comprises accessing a first look up table (T1) comprising battery voltage as a function of SoC percentage values, wherein the test battery voltage is obtained.

14. The method of claim 10, wherein determining the SoC at the measured battery voltage comprises accessing a second look up table (T2) comprising SoC percentage values as a function of battery voltage; and obtaining the SoC at the measured battery voltage.

15. The method of claim 10, wherein adjusting the voltage of the battery to the new SoC set point comprises accessing a first look up table (T1) comprising battery voltage as a function of SoC percentage values; and obtaining the voltage of the battery at the new SoC set point.

16. A battery management system for a battery, comprising
 a battery; and
 a controller circuit operable to:
  determine an initial state of charge (SoC) of the battery based at least in part on a nominal capacity profile;
  determine a test voltage for the battery based on the initial SoC and a correction factor;
  set the battery to the test voltage;
  discharge the battery at a rate, wherein the rate is determined by an operational capacity requirement for the battery;
  measure a discharge voltage of the battery after discharging the battery;
  determine a new SoC based at least in part on the discharge voltage;
  determine an error value based on the new SoC and the correction factor;
  determine a corrected SoC based on combining the error value and the initial state of charge; and
  charge the battery to a new voltage based at least in part on the corrected SoC.

17. The battery management system of claim 16, wherein the controller is further operable to send an alert once a threshold voltage is exceeded.

18. The battery management system of claim 16, wherein the controller is further operable to increase a SoC of other batteries in the system prior to setting the battery to the test voltage.

19. The battery management system of claim 16, wherein the controller is operable to access a first look up table (T1) comprising battery voltage as a function of SoC percentage values to determine the test voltage for the battery based on the initial SoC and the correction factor.

20. The battery management system of claim 16, wherein the controller is operable to access a second look up table (T2) comprising SoC percentage values as a function of battery voltage for the battery to determine the new voltage based on the corrected SoC.

* * * * *